(12) United States Patent
Choi et al.

(10) Patent No.: US 8,399,158 B2
(45) Date of Patent: Mar. 19, 2013

(54) HIGH RESOLUTION PHASE SHIFT MASK

(75) Inventors: Chang Ju Choi, Fremont, CA (US);
Cheng-Hsin Ma, Redwood City, CA (US); Sven Henrichs, San Jose, CA (US); Robert H. Olshausen, Menlo Park, CA (US); Yulia Korobko, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 173 days.

(21) Appl. No.: 12/977,903

(22) Filed: Dec. 23, 2010

(65) Prior Publication Data

US 2012/0164563 A1  Jun. 28, 2012

(51) Int. Cl.
*G03F 1/26* (2012.01)
(52) U.S. Cl. .......................................................... 430/5
(58) Field of Classification Search ................ 430/5, 30, 430/322, 323
See application file for complete search history.

(56) References Cited

U.S. PATENT DOCUMENTS

| | | | |
|---|---|---|---|
| 5,858,580 A | 1/1999 | Wang et al. | |
| 7,442,472 B2 * | 10/2008 | Yang | 430/5 |
| 7,470,492 B2 | 12/2008 | Bigwood et al. | |
| 7,585,595 B2 | 9/2009 | Pierrat | |
| 2009/0253051 A1 * | 10/2009 | Kim | 430/5 |

OTHER PUBLICATIONS

Li, et al., "Sub-resolution Assist Feature Modeling for Modern Photolithography Process Simulation," Japanese Journal of Applied Physics, vol. 47, No. 6, 2008, pp. 4862-4865.

* cited by examiner

*Primary Examiner* — Stephen Rosasco
(74) *Attorney, Agent, or Firm* — Finch & Maloney PLLC

(57) ABSTRACT

Techniques are disclosed for fabricating lithography masks, which include a first level process comprising lithography and etching to form mask frame and in-die areas, and a second level process comprising lithography and etching to form one or more mask features in the in-die area. At least one of the mask features has a smallest dimension in the nanometer range (e.g., 32 nm technology node, or smaller). The techniques may be embodied, for example, in a lithography mask for fabricating semiconductor circuits. In one such example case, the mask includes a frame area and an in-die area formed after the frame area. The in-die area includes one or more mask features, at least one of which has a smallest dimension of less than 100 nm. The mask has a critical dimension bias of less than 20 nm and a structure that comprises a substrate and an absorber layer.

22 Claims, 3 Drawing Sheets

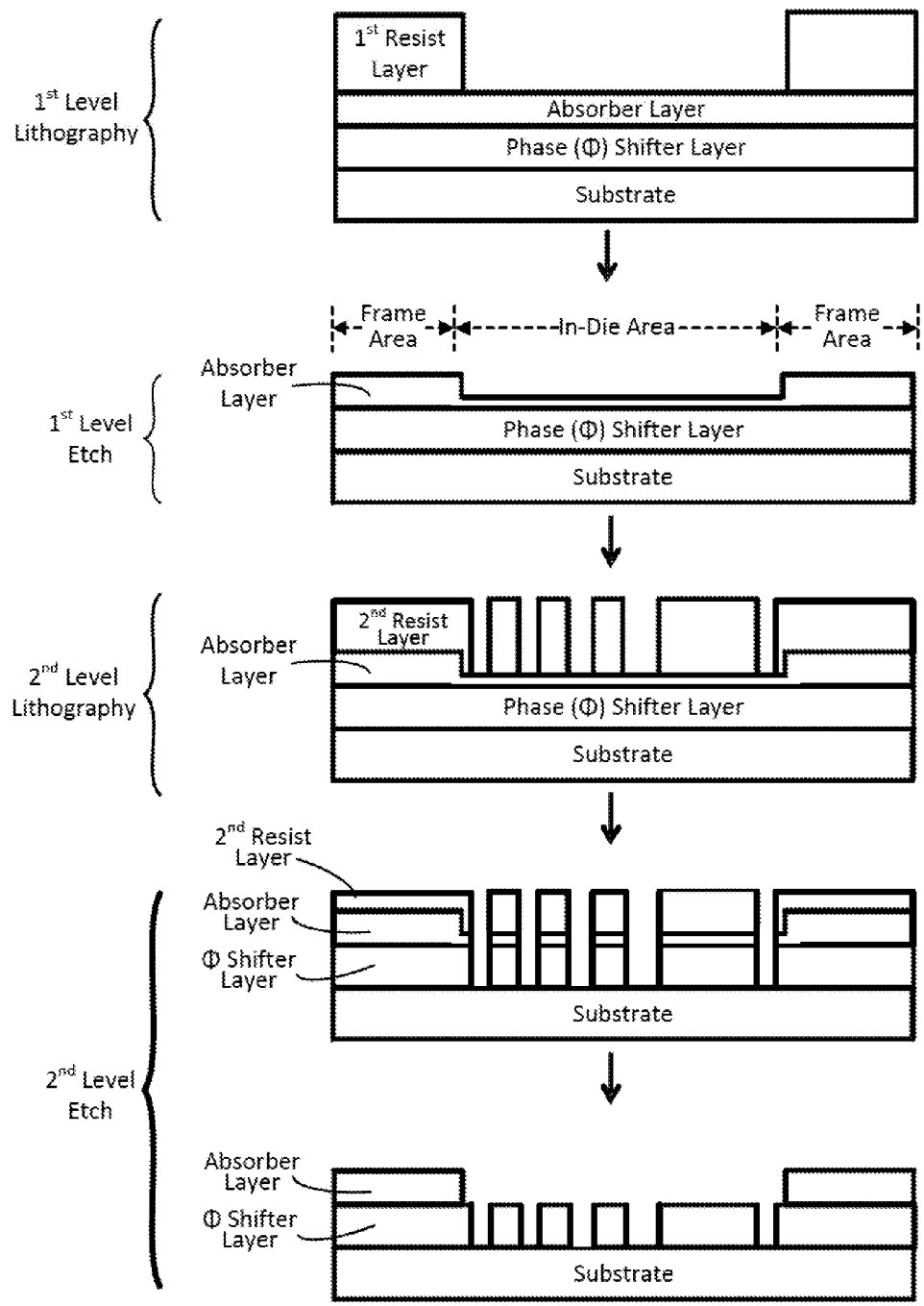

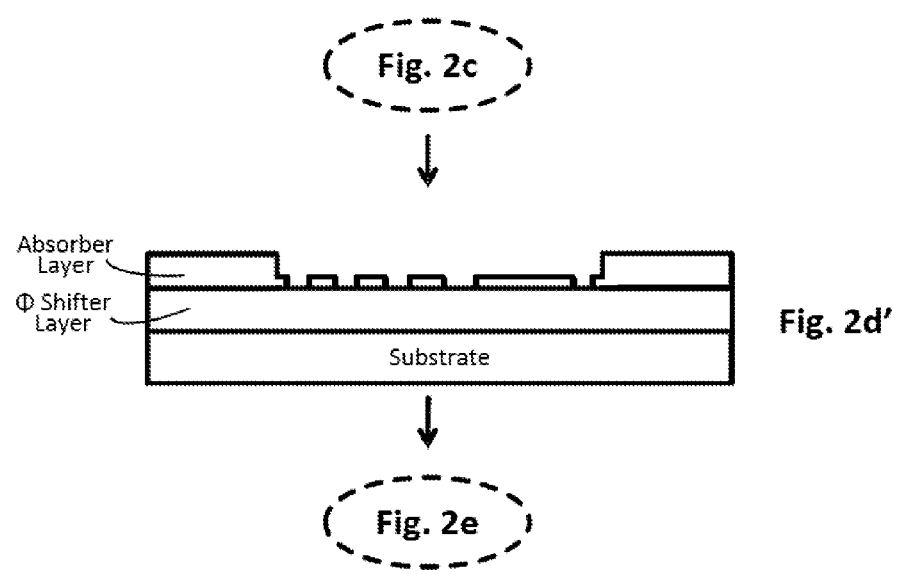

HIGH RESOLUTION PHASE SHIFT MASK

BACKGROUND

As is known, lithography is commonly used when manufacturing integrated circuits. The process generally includes forming a photoresist layer on the surface of a semiconductor wafer, and then positioning a mask over the resist-coated wafer. The mask typically has light non-transmissive (opaque) regions of chrome and light transmissive (transparent) regions of quartz. Radiation from a light source (e.g., ultra-violet or deep ultra-violet light, etc) and focused via an optical lens system is then applied to the mask. The light passes through the transparent mask regions and exposes the underlying photoresist layer, and is blocked by the opaque mask regions to leave those underlying portions of photoresist layer unexposed. Depending on the specific process used, either the exposed or non-exposed regions of photoresist layer can then be removed, thereby leaving a patterned resist layer on the wafer, which in turn allows for subsequent processing of the wafer such as, for example, etching, depositing, and other typical semiconductor processes.

As is further known, the depth of field of the optical lens system is inversely proportional to the numerical aperture of the lens system, and since the surface of the integrated circuit is generally not optically flat, there is a tradeoff between good focus and good resolution. In this sense, limitations on conventional lithography processes effectively limit the minimum realizable dimensions of circuitry being formed on the wafer. One conventional technique that enables smaller minimum device dimensions is generally referred to as phase shift masking (PSM).

Conventional PSM techniques included, for example, embedded phase shift mask (EPSM) and alternating phase shifter mask (APSM). However, such conventional PSM processes are associated with a number of non-trivial problems, some of which limit minimum attainable feature size.

BRIEF DESCRIPTION OF THE DRAWINGS

FIGS. 2a, 2b, 2c, 2d, and 2e illustrate a PSM process flow and lithography mask configured in accordance with an embodiment of the present invention.

FIG. 2d' shows an alternative embodiment of the present invention, where the previous discussion with reference to FIGS. 2a, 2b, 2c, and 2e is equally applicable.

DETAILED DESCRIPTION

Figure 1A:
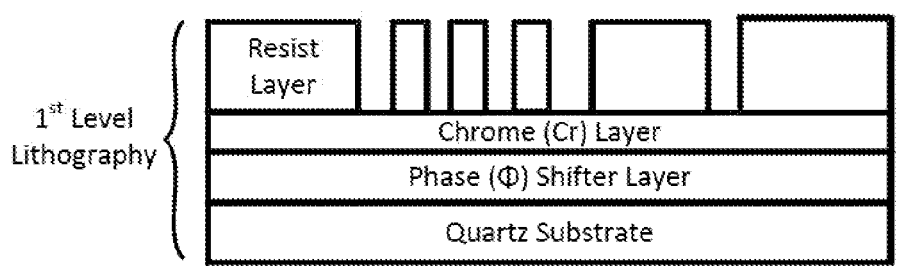
FIGS. 1a-d collectively illustrate a conventional PSM process flow and lithography mask structure.

Techniques are disclosed that allow for integration of high resolution phase shift mask (PSM) process technology with existing conventional blank mask substrates or PSM blanks which are already in full production. In some such embodiments, the techniques can be used to allow very high critical dimension resolution PSM integration by changing integration flow and etch processes, while preserving the optical density in the periphery of the mask. The techniques can be embodied in any number of mask configurations, including APSM, EPSM, and Cr-less phase shift lithography (CPL) masks. In some embodiments, the masks can be used in the fabrication of products requiring high critical dimension resolution PSM masks, for example, for <32 nm or <22 nm technology nodes.

General Overview

As is generally known, PSM exploits the destructive interference caused by light passing through two adjacent transparent mask areas to create an unexposed area on the photoresist layer. In short, the phase of the light wave passing through and exiting the transparent mask regions is a function of the mask thickness, so mask thickness of adjacent mask regions can be selectively varied, such that the light exiting from those adjacent regions is out of phase which causes destructive interference (e.g., where light waves exiting from one adjacent area have a phase that is out-of-phase with light waves exiting from the other adjacent area, and the waves therefore cancel one another or otherwise yield a combined wave of diminished amplitude). Since the photoresist material coated on the wafer being processed is responsive to the intensity of the light, an unexposed area will be formed on the photoresist layer where the transparent regions of differing thicknesses are adjacent.

However, and as previously explained, conventional PSM techniques such as embedded phase shift mask (EPSM) and alternating phase shifter mask (APSM) are associated with a number of non-trivial problems. For example, conventional PSM techniques generally require thinner resist during the mask making process to meet tighter critical dimension resolution requirements of a given mask. Using thinner resist, however, can cause etch selectivity issues between the chrome regions and the resist regions during the mask making process, and therefore effectively remains a limitation in next generation PSM mask technologies. In addition, solutions that attempt to address such etch selectivity issues are generally constrained by the competing desire to maintain a minimum desired optical density (e.g., ~3), which helps eliminate stray light problems during wafer exposure. One common solution is to modify existing PSM blank structures (with additional hardmask layers, etc) to overcome the etch selectivity issue, but such modification techniques involve relatively more complicated processes (with ~2x more layers) and are also associated with undesirable production/cost related issues.

In contrast, an embodiment of the present invention integrates high resolution PSM processes (e.g., EPSM, APSM, and CPL) with using simple traditional blanks. In such embodiments, by changing the integration flow, critical dimension resolution (linearity and bias) can be significantly improved. To best understand concepts underlying various example embodiments of the present invention provided herein, it will be helpful to first review a typical conventional PSM process flow that can be used to produce a conventional photomask configuration.

Figure 1B:
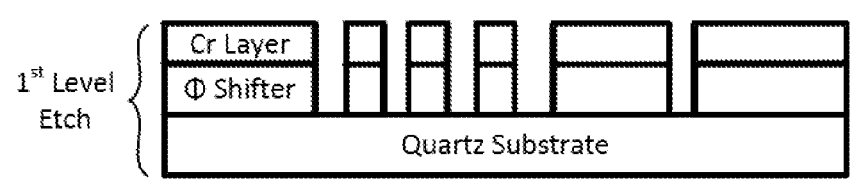

To this end, reference is now made to FIGS. 1a-d, which collectively illustrate a conventional PSM process flow and lithography mask structure. As can be seen, the process flow generally includes first and second levels, with each level including lithography and etch processes. As is the case with the current and long-standing industry standards, this is a frame-second PSM flow, meaning that the frame-defining lithography and etch processes of the flow are a second level process (FIGS. 1c-d) that follow a high-resolution first level process (FIGS. 1a-b).

In more detail, FIG. 1a illustrates the first level lithography, which typically entails high resolution electron beam (e-beam) lithography for in-die area patterning. The initial structure shown includes a quartz substrate having a phase shifter layer deposited thereon. This phase shifter layer can be implemented, for example, with quartz or molybdenum silicide (MoSi). A chrome layer is deposited on the phase shifter layer. A resist layer is deposited on the chrome layer, and then patterned using e-beam lithography which allows some of the resist to be removed as shown. FIG. 1b illustrates the mask structure after the first level etch is performed, which entails in-die area patterning for both the chrome and phase shifter layers. The patterned resist is then removed.

Figure 1C:
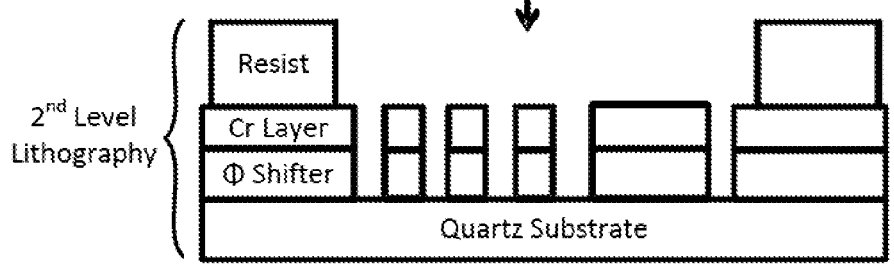
Figure 1D:
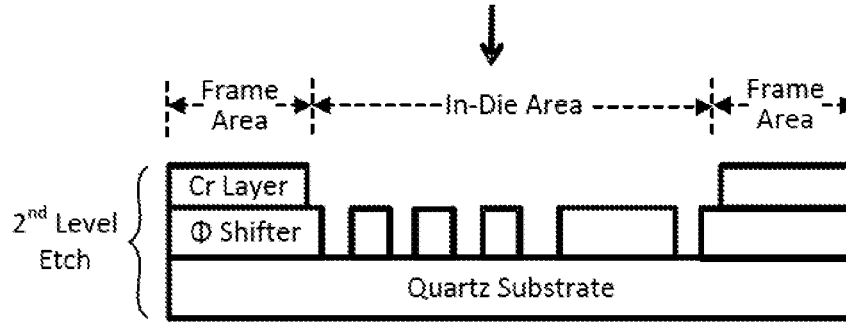

FIG. 1c illustrates the mask structure after the second level lithography is performed, to define the frame area. In this part of the conventional mask forming process, the in-die area is exposed and the frame area is covered with photoresist. The in-die area of the mask generally refers to the middle portion of the mask that includes the pattern of the circuit or device to be formed by the mask, and the frame area is generally the perimeter or outer portion of the mask. FIG. 1d illustrates the mask structure after the second level etch is performed, which removes the chrome in the in-die area and leaves the chrome in the frame area only. After the second level etch to remove the chrome, the resist layer can then be removed from the frame area. The original frame area thickness is thus preserved throughout the mark forming process.

Thus, a conventional PSM process flow has a $1^{st}$ level process to define high resolution chrome/shifter patterns with e-beam lithography and etch processes. Subsequent $2^{nd}$ level lithography/etch processes (low resolution, flood exposure) are used to then remove the in-die chrome layers while protecting the chrome in the frame area. In contrast to such conventional frame-second flows, an embodiment of the present invention employs a frame-first PSM process flow, as will now be explained in further detail with reference to the example flows shown in FIGS. 2a-2e.

Methodology

FIGS. 2a, 2b, 2c, 2d, and 2e collectively illustrate a PSM process flow and lithography mask configured in accordance with an embodiment of the present invention. As can be seen, the process flow generally includes first and second levels, with each level including lithography and etch processes. Unlike conventional PSM process flows, this example embodiment is a frame-first PSM flow, meaning that the frame-defining lithography/etch of the flow is a first level process (FIGS. 2a-b) that precedes a high-resolution second level process (FIGS. 2c-e).

The initial mask structure shown in FIG. 2a includes a substrate having an optional phase shifter layer deposited thereon. An absorber layer is deposited on the phase shifter layer. A first resist layer is deposited on the absorber layer, and then patterned using, for instance, e-beam or ion beam or laser lithography, which allows some of the resist to be removed as shown. Alternatives to this example structure will be apparent. For instance, in embodiments configured without the optional phase shifter layer, the absorber layer can be deposited directly onto the substrate. In other embodiments, the optional phase shifter layer can be integrated into the substrate layer (rather than having a separate phase shifter layer), where different substrate layer thicknesses are provided by etching to allow for desired phase shifting of light passing therethrough.

The substrate can be any transmissive or partially transmissive material suitable for the application for the target application. Example substrate materials include quartz, glass, silicon, silicon nitride or oxynitride, and boron nitride. The optional phase shifter layer can be implemented, for example, with similar transmissive or partially transmissive materials, such as quartz or molybdenum silicide (MoSi). The absorber layer can be implemented, for example, with chrome, aluminum, tantalum, silicon nitride, titanium nitride, and/or other materials having a desired degree of opacity, including single layer or multi-layer constructions (e.g., chrome/MoSi/chrome). The resist can be, for example, polymethyl methacrylate (PMMA), ultraviolet photoresists, ZEP series resists, EBR series resists, or NEB series resists. As will be appreciated in light of this disclosure, other suitable substrate, phase shifter, absorber, and resist materials can be used, along with any number of suitable deposition and etching techniques, and the claimed invention is not intended to be limited to any particular mask materials or formation techniques.

As previously explained, existing standard blank mask structures can be used for the initial structure shown in FIG. 2a, and as such, modified or otherwise exotic or further customized blanks are not needed. In one specific example case, the initial blank structure includes an absorber film on top of a quartz shifter layer or substrate. The absorber film can be, for example, a single chrome layer, a tantalum-based single layer, or sandwiched multi-layers such as chrome/MoSi/chrome. This thickness of the layers can vary as needed, depending on factors such as the technology node and device being formed. In one example case for <32 nm technology PSM masks, the substrate can be implemented, for instance, with a quartz plate having a thickness in the range of 1000 microns to 0.5 inches (e.g., 0.25 inches). The optional phase shifter layer can be implemented, for example, by etching the quartz substrate in the range of 10 nm to 500 nm (e.g., 200 nm), and the absorber layer can be in the range of 10 nm to 500 nm thick (e.g., 200 nm). In other embodiments, the optional phase shifter is a discrete layer (e.g., 10 nm to 500 nm thick) deposited on the substrate. In one specific such example, the optional phase shifter layer and the absorber layer have initial thicknesses of 200 inn and 125 nm, respectively. As will be appreciated in light of this disclosure, the dimensions (e.g., thickness, etc) of the various mask layers can vary depending on factors such as the desired phase shift, the layer material or materials, and the wavelength of light used during semiconductor manufacturing processes that employ the mask, and the claimed invention is not intended to be limited to any particular range of mask layer dimensions.

As can be further seen, FIG. 2a illustrates a first level frame area lithography process, in accordance with one embodiment of the present invention. In accordance with one such example embodiment, the first level lithography used to form the structure shown in FIG. 2a is low resolution, flood exposure lithography to open the active area of the mask die (the in-die area) after the first resist layer is deposited over the absorber layer. In some such embodiments, this first level lithography includes appropriate alignment marks and metro marks. As previously, explained, laser exposure and/or e-beam lithography can be used, or any other suitable patterning techniques (e.g., ion beam lithography).

FIG. 2b illustrates a first level partial absorber etch that leaves a thin absorber layer over the in-die area, in accordance with one embodiment. This remaining thin layer of absorber material can be used as a hardmask in subsequent processing. In an alternative embodiment, a full absorber etch can be used to remove the absorber layer over the in-die area. As will be appreciated in light of this disclosure, the first level reduction (or removal) of the absorber thickness over the in-die area enables subsequent high resolution patterning of the absorber and optional phase shifter layers the in a second level process.

This first level etch process to partially or fully remove the absorber layers in the die active area can be carried out, for example, with flood exposure lithography using a plasma etch that includes a suitable etchant such as chlorine and one or more additive gases such as oxygen, nitrogen, argon, helium, etc, to have an appropriate etch rate, as sometimes done in etch processes. To control the etch rate uniformity, the etch plasma can be maintained at low pressure (e.g., <50 milliTorr) and biased RF powers, for example, at >5 W, in accordance with some example embodiments. Note that in some embodiments of the present invention, an additional control knob (with 1$^{st}$ level etch) can be added to control critical dimension uniformity. Numerous process parameter settings and variations thereof will be apparent in light of this disclosure.

The depth of the first level etch can be varied, for example, in the range of 30% to 100% of initial absorber layer thickness in the die active area only, in accordance with some example embodiments. Note that the absorber layer thickness remaining after the etch (if any) can be selected to have good correlation with final shifter critical dimension, so this etch depth can be used as an integration parameter to determine the final shifter critical dimension. The first level etch uniformity can be used as another integration parameter to compensate for second level shifter critical dimension uniformity issues, if any. As will be appreciated, the etch recipe can be controlled to leave the desired absorber layer thickness and uniformity. As further shown in FIG. 2b, after the absorber thickness over the in-die area is etched to the desired thickness, the first resist layer can be removed (e.g., using solvent or any suitable resist removal technique).

This high resolution second level process includes active area lithography and etch processes. FIG. 2c illustrates the mask structure after the second level lithography is performed, in accordance with one embodiment. As previously explained, any suitable lithography process can be used, such as e-beam or ion beam. In one specific example such case; the second level lithography is carried out using e-beam lithography to pattern the second resist layer, which can be any appropriate resist material or materials suitable for high resolution patterning. In one example case, the second resist layer is implemented with PMMA. Numerous resist materials and layer configurations can be used here. In any case, the second resist layer is coated or otherwise formed over the absorber layer topography defined during the first level process described with reference to FIGS. 2a-b. The minimum thickness of the second resist layer can be determined, for example, by the remaining thickness of the absorber layer (which can be chrome in some example embodiments). In one specific example case, the second resist layer can be thinned down to less than 200 nm (e.g., 50-125 nm) for high resolution lithography, assuming there will be no resist coat coverage issue in frame area. If so, thinning can be limited to the resist over the in-die area using, for example, an intermediate masking process to protect the frame resist. The e-beam lithography (or other litho process) can align to the first level alignment and metro marks, and the second resist layer can be patterned thereof as shown in FIG. 2c.

FIG. 2d illustrates the mask structure after the second level etch is performed, in accordance with one embodiment. In this particular example embodiment, the etch process includes an absorber etch and a shifter etch, which can be carried out in the same etch step or separate etch steps, but both with the second resist layer in place in accordance with this example embodiment. In one specific example case, the absorber layer is chrome and a phase shifter layer of a MoSi is provided, and the second level etch defining the thin chrome layer (remaining from the first level etch over the in-die area) and MoSi shifter layer is a high resolution etch process. Note, however, that in other embodiments so as those where the absorber was completely removed from the in-die area during the first level etch, this second level etch process includes the phase shifter only (which may be, for example, a separate phase shifter layer, or the substrate itself). As can further be seen with reference to the specific example embodiment shown in FIG. 2d, with the remaining second resist and absorber layers still present, the underlying shifter layer (e.g., MoSi layer or Quartz substrate) is etched. The depth of the etch, which in the example embodiment shown is down to the substrate, can vary depending on factors such as the desired phase shift through the transparent portions of the mask and the materials used to implement the various mask layers. The etchant can be, for example chlorine or other suitable etchant, along with various additive gases such as oxygen, nitrogen, argon, helium, etc, to have an appropriate etch rate. Wet or dry etch processes can be used, and the claimed invention is not intended to be limited to a particular etch process or etchants.

After the shifter etch of FIG. 2d, the remaining portion of the second resist layer can be removed (via $O_2$-containing plasma or a solvent, or any other suitable resist removal technique), as best shown in FIG. 2e. In one particular embodiment that uses a remaining thin absorber layer over the in-die area as a hardmask, after the shifter etch and removal of the remaining second resist layer, the remaining portion of the absorber layer over the die area can be removed (e.g., within the etch tool). Note that without the resist in place during removal of the in-die remaining absorber layer areas, the top surface of the peripheral/frame absorber layer areas may also be slightly removed. Numerous variations on this process will be apparent in light of this disclosure. Moreover, note that an issue with conventional PSM process flows is that it is difficult to avoid significant critical dimension bias during a thick chrome etch. In contrast, an embodiment of the present invention having a thinned absorber layer over the in-die area allows for a reduced critical dimension bias (e.g., reduction of greater than 10 nm to 15 nm, or better).

FIG. 2d' shows an alternative embodiment, where the previous discussion with reference to FIGS. 2a, 2b, 2c, and 2e are equally applicable here. However, in this alternative embodiment, the thin layer of absorber (e.g., chrome) remaining after a first level partial absorber etch in the in-die area is patterned into a hardmask that can now be used in the second level etch of the phase shifter. In particular, the thinned in-die absorber is etched with second resist layer. After the absorber etch, the second resist layer is removed (e.g., with $O_2$-containing plasma). After removal of the second resist layer, the phase shifter is etched with the chrome (or other absorber material) hardmask. The chrome/absorber layer of the in-die area can then be subsequently etched/stripped or otherwise removed, thereby providing the mask structure shown in FIG. 2e. Further note that, in some embodiments, the second level etch may also remove a top surface (e.g., 5 nm to 25 nm, or more) of the absorber layer in the mask frame area.

Other variations will be apparent. For instance, note that the last absorber strip/removal process (e.g., over the in-die area) may be part of the second level process or can be also separated into a standalone process and/or optional third level lithography process. In one such example case, an optional third level lithography/etch process can be carried out, for instance, to avoid absorber (e.g., chrome) recess in the peripheral frame area, where the third level process can be used to protect frame absorber material by using additional flood exposure beam and simple etch process).

As will be appreciated in light of this disclosure, the techniques described herein can be used to provide a number of advantages, in accordance with various embodiments of the present invention. For instance, in some embodiments of the present invention, the critical dimension resolution can be modulated by controlling a remaining absorber layer thickness during the first level process. In addition, the etch critical dimension bias may be reduced (e.g., to <10 nm or <5 nm) or otherwise improved in accordance with some embodiments, while conventional PSM processes typically show an etch critical dimension bias of, for example, greater than 20 nm.

Such improvements in critical dimension bias can be achieved with no optimization. In addition, the critical dimension target may be modulated by the first level etch depth, while conventional techniques do not provide such capability. Also, critical dimension uniformity may be modulated by the first level etch uniformity, while conventional techniques do not provide such capability. In addition, some embodiments may use existing production PSM blanks (e.g., such as those having a chrome layer thickness greater than 50 nm), thereby providing less expensive options, particularly for PSM masks operable for applications below the 32 nm and 22 nm technology nodes. In addition, in some embodiments, fewer process tools are required due to fewer process steps, relative to conventional hardmask PSM. Also, there may be fewer quality-based rejections due to the ability to use existing or production proven PSM blanks.

Thus, various embodiments of the present invention can be employed to provide excellent PSM mask quality. High resolution PSM masks configured in accordance with an embodiment of the present invention can be used to provide wider mask options for next generation litho processes, such as those processes carried out on 22 nm technology nodes, or smaller. In addition, a significant cost reduction may be realized, in that an existing mask substrate (blank) and process tools can be used, thereby reducing development and production cost.

One example embodiment of the present invention provides a method for fabricating a lithography mask. The method includes a first level process comprising lithography and etching thereby forming a mask frame area and an in-die area. The method further includes a second level process comprising lithography and etching thereby forming one or more mask features in the in-die area formed during the first level process. At least one of the mask features has a smallest dimension in the nanometer range. In some example cases, the method can be carried out, for instance, on an initial mask structure comprising a substrate and an absorber layer. This initial mask structure may be, for example, a PSM blank. In one specific example case, the initial mask structure further comprises a phase shifter layer that is either integrated into the substrate or between the substrate and the absorber layer. In one such case, the phase shifter layer is the same material as the substrate. In another example case, the mask is a high resolution mask for use in forming circuitry having features size of less than 100 nm, although the techniques provided herein can be used with any technology nodes. In another example case, etching of the first level process reduces thickness of all absorber material in the in-die area of the mask by, for instance, 30% to 100%. In another example case, etching of the first level process reduces thickness of all absorber material in the in-die area but leaves a layer of absorber material to be used as a hardmask dining the second level process. In another example case, etching of the first level process reduces thickness of all absorber material in the in-die area, and the absorber material thickness remaining after this etching is selected to have correlation with a final critical dimension of a phase shifter below the absorber material. In another example case, etching of the first level process provides uniformity of an absorber material in the in-die area, and the absorber material uniformity compensates for critical dimension uniformity of a phase shifter that is below the absorber material and etched during the second level process. In another example case, a first resist layer used to form the in-die area during the first level process is removed prior to commencing the second level process. In another example case, lithography of the first level process includes alignment marks and lithography of the second level process aligns to those marks. In another example case, the second level process includes applying and patterning a second resist layer over absorber layer topography defined during the first level process. In one such specific case, the second resist layer has a thickness that is less than 200 nm. In another example case, the second level etching includes etching of both absorber and phase shifter layers to define a nanometer resolution pattern. This etching may be carried out, for instance, in the same etch process or different etch processes. After this second level etching, the method may further include removing resist applied to form the nanometer resolution pattern (if applicable) and/or removing remaining absorber material in the in-die area (if applicable). In one specific such example case, the method may further include removing at least a top surface of absorber material in the frame area (e.g., while removing remaining absorber material in the in-die area). In another example case, the mask allows for a critical dimension bias, for instance, of less than 5 nm. Another example embodiment of the present invention is a lithography mask formed by the methods as described herein.

Another embodiment of the present invention provides a lithography mask for fabricating semiconductor circuits. In this example case, the mask includes a frame area and an in-die area formed after the frame area, the in-die area including one or more mask features, wherein at least one of the mask features has a smallest dimension of less than 100 nm. The mask has a critical dimension bias of less than 20 nm and a structure that includes a substrate and an absorber layer. In one such example case, the mask structure further comprises a phase shifter layer that is either integrated into the substrate or between the substrate and the absorber layer. In another example case, at least a portion of the absorber layer has a thickness of greater than 50 nm. Note that a conventional PSM mask forming process would generally not be able to provide a high resolution pattern including features sizes less than 100 nm with a mask structure having an absorber layer greater than 50 nm. In another example case, at least a top surface of absorber material in the frame area has been removed (e.g., during removal of the hardmask absorber material in the in-die area). In another example case, the mask allows for a critical dimension bias of less than 5 nm.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A method for fabricating a lithography mask, comprising:
    a first level process including lithography and etching thereby forming a mask frame area and a pattern-free in-die area; and
    a second level process including lithography and etching thereby forming one or more mask features in the in-die area formed during the first level process, wherein at least one of the mask features has a smallest dimension of less than 100 nm.

2. The method of claim 1 wherein the method is carried out on an initial mask structure comprising a substrate and an absorber layer.

3. The method of claim 2 wherein the initial mask structure further comprises a phase shifter layer that is either integrated into the substrate or between the substrate and the absorber layer.

4. The method of claim 3 wherein the phase shifter layer is the same material as the substrate.

5. The method of claim 2 wherein the absorber layer is a multi-layer construction made from at least two different materials.

6. The method of claim 1 wherein etching of the first level process reduces thickness of all absorber material in the in-die area of the mask by 30% to 100%.

7. The method of claim 1 wherein etching of the first level process reduces thickness of all absorber material in the in-die area but leaves a layer of absorber material to be used as a hardmask during the second level process.

8. The method of claim 1 wherein etching of the first level process reduces thickness of all absorber material in the in-die area, and the absorber material thickness remaining after this etching is selected to have correlation with a final critical dimension of a phase shifter below the absorber material.

9. The method of claim 1 wherein etching of the first level process provides uniformity of an absorber material in the in-die area, and the absorber material uniformity compensates for critical dimension uniformity of a phase shifter that is below the absorber material and etched during the second level process.

10. The method of claim 1 wherein a first resist layer used to form the in-die area during the first level process is removed prior to commencing the second level process.

11. The method of claim 1 wherein lithography of the first level process includes alignment marks and lithography of the second level process aligns to those marks.

12. The method of claim 1 wherein the second level process includes applying and patterning a second resist layer over absorber layer topography defined during the first level process.

13. The method of claim 12 wherein the second resist layer has a thickness that is less than 200 nm.

14. The method of claim 1 wherein the second level etching includes etching of both absorber and phase shifter layers to define a nanometer resolution pattern, and after this second level etching, the method further comprises at least one of:
removing resist applied to form the nanometer resolution pattern; and
removing remaining absorber material in the in-die area.

15. The method of claim 14 further comprising removing at least a top surface of absorber material in the frame area.

16. The method of claim 1 wherein the mask allows for a critical dimension bias of less than 5 nm.

17. A lithography mask formed by the method of claim 1.

18. A lithography mask for fabricating semiconductor circuits, comprising:
a frame area; and
an in-die area formed after the frame area, the in-die area including one or more mask features, wherein at least one of the mask features has a smallest dimension of less than 100 nm;
wherein the mask has a critical dimension bias of less than 20 nm and a structure that comprises a substrate and an absorber layer.

19. The mask of claim 18 wherein the mask structure further comprises a discrete phase shifter layer that is between the substrate and the absorber layer, and the absorber layer is a multi-layer construction made from at least two different materials.

20. The mask of claim 18 wherein the mask structure further comprises a phase shifter layer that is integrated into the substrate and is the same material as the substrate.

21. The mask of claim 18 wherein the absorber layer is a multi-layer construction made from at least two different materials.

22. The mask of claim 18 wherein the mask allows for a critical dimension bias of less than 5 nm.

* * * * *